(12) United States Patent
Ballandras et al.

(10) Patent No.: US 11,828,668 B2
(45) Date of Patent: Nov. 28, 2023

(54) DIFFERENTIAL ACOUSTIC WAVE PRESSURE SENSOR WITH IMPROVED SIGNAL-TO-NOISE RATIO

(71) Applicant: FREC'N'SYS, Besançon (FR)

(72) Inventors: Sylvain Ballandras, Besançon (FR); Emilie Courjon, Franois (FR); Florent Bernard, Besançon (FR); Thierry LaRoche, Besançon (FR); Julien Garcia, Chamblay (FR)

(73) Assignee: FREC'N'SYS, Besançcon (FR)

( * ) Notice: Subject to any disclaimer, the term of this patent is extended or adjusted under 35 U.S.C. 154(b) by 62 days.

(21) Appl. No.: 17/753,510

(22) PCT Filed: Sep. 4, 2020

(86) PCT No.: PCT/EP2020/074871
§ 371 (c)(1),
(2) Date: Mar. 4, 2022

(87) PCT Pub. No.: WO2021/044035
PCT Pub. Date: Mar. 11, 2021

(65) Prior Publication Data
US 2022/0326102 A1 Oct. 13, 2022

(30) Foreign Application Priority Data

Sep. 4, 2019 (FR) ...................................... 1909735

(51) Int. Cl.
*G01L 9/00* (2006.01)
*G01L 1/16* (2006.01)

(52) U.S. Cl.
CPC ............ *G01L 9/0025* (2013.01); *G01L 1/165* (2013.01); *G01L 9/008* (2013.01)

(58) Field of Classification Search
CPC ....... G01L 1/165; G01L 9/0025; G01L 9/008; H03H 9/02559; H03H 9/02574
See application file for complete search history.

(56) References Cited

U.S. PATENT DOCUMENTS

| | | |
|---|---|---|
| 7,100,451 B2 | 9/2006 | Solie |
| 8,299,679 B2 | 10/2012 | Chommeloux et al. |
| 2015/0013461 A1 * | 1/2015 | Pollard .................. G01H 11/08 73/579 |

FOREIGN PATENT DOCUMENTS

| | | | |
|---|---|---|---|
| WO | WO-2022184815 A1 | * | 9/2022 |
| WO | WO-2022184833 A1 | * | 9/2022 |

OTHER PUBLICATIONS

French Search Report and Opinion for Application No. 1909735 dated Jun. 16, 2022, 10 pages.
(Continued)

*Primary Examiner* — Andre J Allen
(74) *Attorney, Agent, or Firm* — TraskBritt

(57) ABSTRACT

An acoustic wave pressure sensor device configured to measure a pressure, comprising a substrate configured to bend when pressure is applied to the substrate such that an area of a first kind of strain and an area of a second kind of strain are formed in the substrate; an interdigitated transducer formed over the substrate; a first Bragg mirror formed over the substrate and arranged on one side of the interdigitated transducer; a second Bragg mirror formed over the substrate and arranged on another side of the interdigitated transducer; a first resonance cavity formed between the interdigitated transducer and the first Bragg mirror; a second resonance cavity formed between the interdigitated transducer and the second Bragg mirror; and wherein the first resonance cavity is formed over the area of the first kind of strain and the second resonance cavity is formed over the area of the second kind of strain.

20 Claims, 13 Drawing Sheets

(56) References Cited

OTHER PUBLICATIONS

International Search Report for International Application No. PCT/EP2020/074871 dated Dec. 16, 2020, 3 pages.
International Written Opinion for International Application No. PCT/EP2020/074871 dated Dec. 16, 2020, 6 pages.

* cited by examiner

DIFFERENTIAL ACOUSTIC WAVE PRESSURE SENSOR WITH IMPROVED SIGNAL-TO-NOISE RATIO

CROSS-REFERENCE TO RELATED APPLICATIONS

This application is a national phase entry under 35 U.S.C. § 371 of International Patent Application PCT/EP2020/074871, filed Sep. 4, 2020, designating the United States of America and published as International Patent Publication WO 2021/044035 A1 on Mar. 11, 2021, which claims the benefit under Article 8 of the Patent Cooperation Treaty to French Patent Application Serial No. FR1909735, filed Sep. 4, 2019.

TECHNICAL FIELD

The present disclosure relates to sensors of the acoustic wave type and, in particular, differential acoustic wave pressure sensors comprising resonance cavities.

BACKGROUND

Sensors are of growing importance and become more and more ubiquitous in every-day life. Microelectromechanical systems (MEMS) are an attractive option to answer the demand for increased performance of sensors along with decreased sizes and costs. Surface acoustic wave (SAW) sensors, and to a lower extent bulk acoustic wave (BAW) sensors or Lamb wave or Love wave acoustic sensors, offer particularly advantageous options due to a wide variety of measurable ambient parameters including temperature, pressure, strain and torque, for example.

Acoustic wave sensors utilize the piezoelectric effect to transduce an electrical signal into a mechanical/acoustic wave. SAW-based sensors are built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate as, for instance, silicon, if necessary by way of a bonding layer, as, for instance, a silicon oxide layer (in general, any combination of a single crystal piezoelectric material with non-piezoelectric substrates can be used in view of their specific properties like thermal stability or acoustic quality).

A transducer, in the case of a surface acoustic wave sensor, an interdigitated transducer (IDT), converts the electrical energy of the electrical signal into acoustic wave energy. The acoustic wave travels across the surface (or bulk) of a device substrate via the so-called delay line to another transducer, in particular, an IDT, that converts the acoustic wave back to an electrical signal that can be detected. In some devices mechanical absorbers and/or reflectors are provided in order to prevent interference patterns and reduce insertion loss. In some devices the other (output) IDT is replaced by a reflector that reflects the generated acoustic wave back to the (input) IDT that can be coupled to an antenna for remote interrogation of the sensor device. Advantageously, the measurements can be performed completely passively, i.e., the sensor has not to be powered by a power source.

A particular class of acoustic wave sensors comprises resonators exhibiting resonance frequencies that vary according to varying ambient conditions. FIG. 1 illustrates an example of a resonant acoustic wave sensor. The surface acoustic wave resonator comprises an electroacoustic interdigitated transducer IDT with interdigitated comb electrodes C and C' arranged between Bragg mirrors M. The comb electrodes are set at opposite potentials +V and −V, respectively. The electrode geometry is defined by the pitch p, i.e., the spatial repetition frequency of the interleaved electrodes C and C' in the direction of the propagation of the excited surface acoustic waves, the lengths of the gaps between the electrodes C and C' in the direction perpendicular to the direction of the propagation of the excited surface acoustic waves, the lengths of the acoustic aperture region given by the lengths of the electrodes C and C' between the gaps and the widths a of the electrodes C and C' determining the so-called metallization ratio when compared to the pitch (a/p). The IDT can operate at Bragg conditions at which the wavelength λ of the excited surface acoustic wave equals twice the pitch p, for example.

The sensor device shown in FIG. 1 may also comprise a capping substrate and some sealing to provide for a space that can be filled with some inert gas or evacuated to protect the transducer T and mirrors M against corrosion and to provide a pressure reference. Moreover, a support substrate including some hollow space may be attached to the lower surface of the sensor device shown in FIG. 1, wherein the support substrate provides a fluid conduit by the hollow space for communicating pressure fluctuations to the sensor device that may be covered by some lid.

At the resonance frequency, the condition of synchronism between the reflectors is satisfied thereby allowing to obtain a coherent addition of the different reflections that occur under the reflectors. A maximum of acoustic energy is then observed within the resonant cavity and, from an electrical point of view, a maximum of amplitude of the current admitted by the transducer is observed. In principle, differential acoustic wave sensors may comprise two or more resonators exhibiting different resonance frequencies or a resonator working in multimode (several resonance frequencies), wherein differences in the measured frequencies reflect variations in the ambient parameters that is to be measured (the measurand) as, for example, temperature or pressure.

Usage of an acoustic wave sensor as the one shown in FIG. 1 for the measurement of pressures is of particular interest. For example, by way of such a sensor the pressure of a tire of a vehicle can be sensed. When the sensor experiences some pressure variation compared to the reference pressure (given by the inert gas or vacuum on the propagation side) the surface strain of the piezoelectric layer changes, the velocity of the excited acoustic waves changes and the spatial intervals of the electrodes of the transducer and mirrors change. Accordingly, the resonance frequency changes, and based on this change in resonance frequency, the ambient pressure can be detected.

However, despite the recent engineering process, the entire interrogation process wherein an interrogator transmits an appropriate radiofrequency signal that is received by the acoustic wave sensor via a reception antenna and converted by a transducer into a surface acoustic wave (or bulk wave, in the case of devices of a bulk acoustic wave sensor type) that is converted into a radiofrequency signal being re-transmitted via an emission antenna and received and analyzed by the interrogator still poses demanding technical problems. Particularly, radiofrequency noise present in the commonly used ISM (Industrial, Scientific, Medical) bands, for example, in bands with a center frequency of 434 MHz or 2.45 GHz, causes reading/interpretation errors affecting the quality of the generation and analysis of response spectra provided by the sensor devices.

True differential measurements based on an appropriate differential sensitivity of the resonances of the resonator(s) used to the measurand (pressure in the case of an acoustic wave pressure sensor) have to be accurately observed in order to obtain reliable measurement results. This poses severe demands for tolerances of the production processes and reproducibility of physical properties from one wafer to another. In addition, any relative motion between the sensor device and the interrogator can heavily affect the measurement results due to the RF link formed by the sensor device and the interrogator in an inductive, capacitive or radiative manner. Other environmental influences, for example, temperature changes, in the measurement environment also affect the reliability of the measurement results.

Therefore, it is an object of the present disclosure to provide an acoustic wave pressure sensor that allows for an increased signal-to-noise ratio and more reliable measurement results as compared to the acoustic wave pressure sensor devices of the art.

BRIEF SUMMARY

The present disclosure addresses the above-mentioned object by providing an acoustic wave pressure sensor device, in particular, a surface acoustic wave pressure sensor device, configured to measure a pressure, comprising:
- a substrate (for example, in the form of a membrane) configured to bend when the pressure to be measured is applied to the substrate such that an area of a first kind of strain (stress) and an area of a second kind of strain (stress) are formed in the substrate;
- an interdigitated transducer (comprising comb electrodes) formed over the substrate;
- a first Bragg mirror formed over the substrate and arranged on one side of the interdigitated transducer;
- a second Bragg mirror formed over the substrate and arranged on another side of the interdigitated transducer;
- a first resonance cavity (for example, exclusively) formed between the interdigitated transducer and the first Bragg mirror; and
- a second resonance cavity (for example, exclusively) formed between the interdigitated transducer and the second Bragg mirror;
- and wherein
- the first resonance cavity is formed over the area of the first kind of strain and the second resonance cavity is formed over the area of the second kind of strain.

The substrate may be a multi-layer substrate comprising a piezoelectric layer (see also description below) or a homogeneous (single-layer) piezoelectric substrate. The second kind of strain is different from the first kind of strain. The first kind of strain may be a compressive strain and the second kind of strain may be a tensile strain and vice-versa. Alternatively, one of the first kind of strain and the second kind of strain may be a compressive strain or a tensile strain and the other one of the first kind of strain and the second kind of strain may be substantially no strain.

According to the present disclosure the acoustic wave pressure sensor device comprises one resonance cavity formed over an area of a substrate exhibiting the first kind of strain (for example, a compressive strain) in reaction to the application of an ambient pressure whereas another resonance cavity is formed over an area of the substrate exhibiting a second kind of strain, for example, a tensile strain, in reaction to the application of the ambient pressure. Thereby, a true reliable differential measurement of the ambient pressure is made possible by way of one single interdigitated transducer and two Bragg mirror structures (each comprising elongated electrodes arranged in parallel to each other) that are neighbored to the transducer on one side and another side of the transducer, respectively, if the transducer works at Bragg condition and exhibits a reflection coefficient larger than 50%, preferably, larger than 80%.

The acoustic wave pressure sensor device may be a Piezo-On-Insulator (POI) device comprising a multi-layer substrate wherein a dielectric layer is formed on a bulk substrate and a piezoelectric layer is formed on the dielectric layer. The bulk substrate consists of or comprises, for example, Si, the dielectric layer consists of or comprises, for example, $SiO_2$, and the piezoelectric layer consists of or comprises, for example, $LiNbO_3$ or $LiTaO_3$. In the case of a POI device, the interdigitated transducer and the first and second Bragg mirrors are formed on the piezoelectric layer and the first and second resonance cavities comprise portions of the piezoelectric layer, and the piezoelectric layer is configured to bend when the pressure is applied to the substrate such that an area of the first kind of strain is formed in the piezoelectric layer (for example, over an area of the first kind of strain of the bulk) substrate and an area of the second kind of strain is formed in the piezoelectric layer (for example, over an area of the second kind of strain of the bulk) substrate.

The substrate is configured to exhibit, when the pressure is applied, an area of reversal of strain wherein the strain changes from the first kind of strain to the second kind of strain. According to a particular embodiment, the interdigitated transducer is arranged over the area of reversal of strain. Thereby, it can be guaranteed that the resonance frequency shift experienced by the resonator cavities when an ambient pressure is applied varies truly differentially thereby facilitating very reliable measurements.

In the case of a POI-device the piezoelectric layer (as the substrate) is configured to exhibit, when the pressure is applied, an area of reversal of strain, wherein the strain changes from the first kind of strain to the second kind of strain and the interdigitated transducer can be arranged on the area of reversal of strain of the piezoelectric layer.

Moreover, cascaded resonance cavities can be formed in the acoustic wave pressure sensor device, according to one of the above-described embodiments, in order to reduce the number of resonances in order to obtain unique measurement results. Thus, the acoustic wave pressure sensor device according to one of the above-described examples may be configured such that the first resonance cavity comprises first resonance sub-cavities separated from each other by first reflection sub-structures of the first Bragg mirror and/or the second resonance cavity comprises second resonance sub-cavities separated from each other by second reflection sub-structures of the second Bragg mirror. Each of the first and second reflection sub-structures may consist of elongated electrodes arranged in parallel to each other.

In all of the above-described embodiments, the extension lengths (in the direction of propagation of the acoustic waves) of the first resonance cavity and the second resonance cavity may differ from each other in order to more clearly separate the spectral responses of the resonances of the first resonance cavity and the second resonance cavity from each other. According to the above-described present disclosure principle, the IDT itself may operate as a Bragg mirror for the first and second cavities in such a way that the modes of each cavity are not interacting together and therefore cannot impact one another.

In general, the acoustic wave pressure sensor device according to one of the above-described examples may be a passive surface acoustic wave pressure sensor device and may further comprise a transmission antenna and a reception antenna (that may or may not be the same antenna) for communication with an interrogation device.

In all of the above-described embodiments, the interdigitated transducer may be replaced by two interdigitated transducers (or two parts of an interdigitated transducer) between which an additional (Bragg) mirror is placed. The lengths and/or apertures of the two interdigitated transducers (or two parts of an interdigitated transducer) may be different from each other. Such a configuration may be advantageous, if the reflectivity of a single interdigitated transducer is not high enough for sufficiently separating the two cavities from each other with respect to their resonance frequencies. The central mirror positioned between the two interdigitated transducers (or two parts of an interdigitated transducer) may provide for the desired high reflectivity of the generated surface acoustic waves.

Moreover, a combined acoustic wave pressure and temperature sensor device, comprising the acoustic wave pressure sensor device according to one of the above-described embodiments, and an additional acoustic wave sensor device, is provided. The acoustic wave pressure sensor device, according to one of the above-described embodiments, and the additional acoustic wave sensor device, are configured to, in particular, differentially, measure an ambient temperature and a surface of a resonance cavity of the additional acoustic wave sensor device is physically and/or chemically modified with respect to a surface of a resonance cavity of the acoustic wave pressure sensor device according to one of the above-described embodiments.

Due to the modification of the surface of the resonance cavity the propagation characteristics of the generated acoustic waves differ from the ones in the unmodified resonance cavity. Thereby, a very reliable and sensitive differential sensor apparatus for sensing an ambient temperature can be provided. The temperature measurement can be used to refine the pressure measurement, in accordance with the ideal gas law PV=NRT, for example, with P the pressure to be measured, V the volume of the gas, N the number of moles of the gas, R the "ideal gas constant" and T the temperature.

The modification may comprise the formation of a material layer, for example, the formation of a metallization layer or passivation/dielectric layer and/or the formation of a recess. The resonance cavity of the acoustic wave pressure sensor device, according to one of the above-described embodiments, may also comprise some physical and/or chemical modification that is different from the one of the surface of the resonance cavity of the additional acoustic wave sensor device.

Furthermore, a system is provided for monitoring/measuring an ambient pressure that comprises an interrogation device and an acoustic wave pressure sensor device, according to one of the above-described embodiments, which is communicatively coupled to the interrogation device.

The interrogation device for interrogating an acoustic wave pressure sensor may comprise a transmission antenna configured for transmitting a radiofrequency interrogation signal to the acoustic wave pressure sensor device, a reception antenna configured for receiving a radiofrequency response signal from the acoustic wave pressure sensor device and a processing means for processing/analyzing the radiofrequency response signal received by the reception antenna in order to determine an ambient parameter that is to be sensed.

Furthermore, it is provided, herein, a method of manufacturing an acoustic wave pressure sensor device, in particular, a surface acoustic wave pressure sensor device, the method comprising the steps of:

providing a substrate (i.e., a multi-layer substrate comprising a piezoelectric layer or a single-layer piezoelectric substrate) configured to bend when a pressure is applied to the substrate such that an area of a first kind of strain and an area of a second kind of strain are formed in the substrate;

determine the locations of the area of the first kind of strain and the area of the second kind of strain of the substrate;

forming an interdigitated transducer over the substrate;

forming a first Bragg mirror over the substrate on one side of the interdigitated transducer such that a first resonance cavity is formed between the interdigitated transducer, in particular, operating at Bragg conditions, and the first Bragg mirror over the determined location of the area of the first kind of strain of the substrate; and forming a second Bragg mirror over the substrate on another side of the interdigitated transducer, in particular, operating at Bragg conditions, such that a second resonance cavity is formed between the interdigitated transducer and the second Bragg mirror over the determined location of the area of the second kind of strain of the substrate.

Again, the second kind of strain is different from the first kind of strain. The first kind of strain may be a compressive strain and the second kind of strain may be a tensile strain. Alternatively, one of the first kind of strain and the second kind of strain may be a compressive strain or a tensile strain and the other one of the first kind of strain and the second kind of strain may be substantially no strain.

The step of determining the locations of the area of the first kind of strain and the area of the second kind of strain of the substrate can be performed by measuring the bending characteristics of a sample substrate of the material(s) used for the formation of the provided substrate by standard experiments comprising the application of test pressures to the sample substrate. It can also be performed based on theoretical or numerical analysis (for instance, based on finite element analysis). The locations of the first and second kinds of strain can be computed provided that the physical properties of the materials (such as for single crystals like quartz, silicon, lithium tantalate or lithium niobate) of the device are perfectly known.

The method may further comprise providing a bulk substrate, for example, a sapphire or silicon bulk substrate, forming a dielectric layer, in particular, consisting of or comprising $SiO_2$, on the bulk substrate and forming a piezoelectric layer, in particular, consisting of or comprising $LiNbO_3$ or $LiTaO_3$, on the dielectric layer. In this embodiment, the interdigitated transducer and the first and second Bragg mirrors are formed on the piezoelectric layer and the first and second resonance cavities comprise portions of the piezoelectric layer and the piezoelectric layer is configured to bend when the pressure is applied to the substrate such that an area of the first kind of strain is formed in the piezoelectric layer (for example, over an area of the first kind of strain of the bulk substrate) and an area of the second kind of strain is formed in the piezoelectric layer (for example, over an area of the second kind of strain of the bulk substrate).

The interdigitated transducer may be formed over an area of reversal of strain of the substrate, the area of reversal of strain being an area wherein, when the pressure is applied, the strain changes from the first kind of strain to the second kind of strain. In particular, the interdigitated transducer may be formed on an area of reversal of strain of the piezoelectric layer, the area of reversal of strain being an area wherein, when the pressure is applied, the strain changes from the first kind of strain to the second kind of strain from one edge of the IDT another. In that case, the mean stress viewed by the IDT is zero but the two cavities on each side of the IDT are submitted to strain of different kinds, thus guarantying a differential effect and measurement of the applied pressure.

The method may be used to provide a sensor device comprising cascaded resonator cavities. In this case, forming the first Bragg mirror comprises forming first reflection sub-structures and/or forming the second Bragg mirror comprises forming second reflection sub-structures such that the first resonance cavity comprises first resonance sub-cavities separated from each other by the first reflection sub-structures of the first Bragg mirror and/or the second resonance cavity comprises second resonance sub-cavities separated from each other by the second reflection sub-structures of the second Bragg mirror. In all of these embodiments of the method of forming an acoustic wave pressure sensor device, the Bragg mirrors may be arranged such that the extension lengths of the first resonance cavity and the second resonance cavity differ from each other.

It should be noted that in the case of using cascaded resonator cavities, it is possible to use a transducer that does not operate at the Bragg condition. Actually in that case, the transducer does not absolutely need to exhibit reflection properties since supplementary reflecting substructures will achieve that function. For instance, the transducer may exhibit three or four fingers per wavelength or even 5 fingers per two wavelength and in general all suitable structures allowing to excite waves at a given synchronism without wave reflection on the IDT electrodes, and be surrounded by two reflecting substructures with an equivalent reflection factor smaller than 90% or even 80% or even less, with one cavity formed on the left hand-side and one cavity formed on the right hand-side of the device by the substructures and, additionally, a larger Bragg mirror with an equivalent reflection coefficient larger than 80% or even 90%, thus enabling resonances to be established in the cavities. This approach allows, for instance, the removal of any directivity effect that may generate unwanted contributions.

BRIEF DESCRIPTION OF THE DRAWINGS

Additional features and advantages of the present disclosure will be described with reference to the drawings. In the description, reference is made to the accompanying figures that are meant to illustrate preferred embodiments of the present disclosure. It is understood that such embodiments do not represent the full scope of the invention.

DETAILED DESCRIPTION

Figure 1:
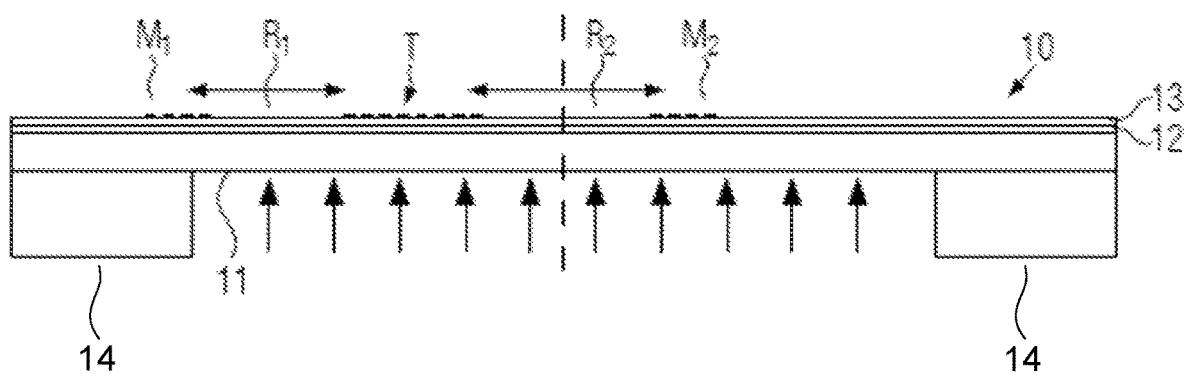
FIG. 1 represents an illustration of a surface acoustic wave pressure sensor device according to an embodiment of the present disclosure.

The present disclosure provides (surface) acoustic wave pressure sensor devices, in particular, passive SAW sensor devices, that are characterized by a high signal-to-noise ratio, sensitivity and reliability due to differential measurements. The acoustic wave pressure sensor devices can be interrogated by any interrogator that is configured to determine a response spectrum from an interrogated acoustic wave sensor. It goes without saying that the present disclosure can be implemented in any devices employing acoustic wave pressure sensor devices or dielectric resonators, RLC circuits, etc.

The interrogation device interrogating one of the inventive acoustic wave pressure sensor devices may comprise a transmission antenna for transmitting a radiofrequency interrogation signal to the sensor device and a reception antenna for receiving a radiofrequency response signal from the sensor device. The radiofrequency interrogation signal transmitted by the transmission antenna may be generated by a signal generator that may comprise a radiofrequency synthesizer or controlled oscillator as well as optionally some signal shaping module providing a suitable frequency transposition and/or amplification of the signal to be transmitted by the transmission antenna. The radiofrequency interrogation signal generated by the signal generator may be a pulsed or bursty signal with a frequency selected according to the resonance frequency of the acoustic wave pressure sensor device.

Furthermore, the interrogation device may comprise a processing means connected to the reception antenna. The processing means may comprise filtering and/or amplification means and be configured for analyzing the radiofrequency response signal received by the reception antenna. For example, the sensor device operates at resonance frequency close to 434 MHz or to 915 MHz or to 2.45 GHz.

The interrogation device may transmit a long radiofrequency pulse and after the transmission has been stopped, the resonance cavities of the sensor device discharge at their resonant eigenfrequencies with time constants T equal to $Q_f/\pi F$ wherein F is the central frequency and $Q_f$ is the quality factor $Q_f$ corresponding to the ratio between the central frequency and the width at half maximum of the band pass used in the interrogation process. For instance, $Q_f$ corresponds to the resonance quality factor estimated on the real part of the resonator admittance (the conductance) when the latter is designed to operate at the resonance. Spectral analysis performed by the processing way of the interrogation device allows for calculating the resonator frequency and, thereby, the sensing of an ambient pressure. The received radiofrequency response signal may be mixed by the processing means with radiofrequency interrogation signal according to the so-called I-Q protocol as known in the art to extract the real and imaginary parts (in-phase components I=Y cos φ and quadrature components Q=Y sin φ with the signal amplitude Y and the signal phase φ) from which the modulus and phase can then be derived.

FIG. 1 illustrates an exemplary embodiment of an inventive surface acoustic wave (SAW) pressure sensor device 10 that is configured to measure an ambient pressure, for example, the pressure of a tire of a vehicle. The SAW pressure sensor device 10 shown in FIG. 2 comprises an interdigitated (a comb) transducer T connected to an antenna (not shown in FIG. 2) for receiving an electromagnetic wave and converting the electromagnetic wave into a surface acoustic wave. The comb transducer T comprises interdigitated electrodes. Two SAW resonance cavities R1 and R2 are provided between the comb transducer T and Bragg mirrors M1 and M2, respectively. It is noted that here and in the following a SAW pressure sensor device comprising one single transducer and two resonance cavities is described. One single transducer and two resonance cavities are sufficient to realize the present disclosure but more than one transducer and more than two resonance cavities may also be provided.

For instance, another differential resonator may be positioned close to the pressure sensor device in a region not subjected to pressure differences. Such a configuration allows for measuring the ambient temperature, for example. According to an embodiment, a temperature/pressure sensor can be fabricated, for instance, using a sensor for which the two resonance cavities are subject to the same mechanical effect but equipped with different surface conditions (see description below), thus allowing an effective temperature measurement that can be used to refine the pressure measurement in accordance with the ideal gas law PV=NRT, for example.

In the embodiment illustrated in FIG. 1, the SAW pressure sensor device 10 comprises a multi-layer substrate comprising a bulk substrate 11, for example, an Si substrate, formed as a membrane that bends under the application of an ambient pressure (indicated by the arrows in FIG. 1). A dielectric layer 12, for example, an $SiO_2$ layer, is formed on the bulk substrate 11. A piezoelectric layer 13, for example, an $LiNbO_3$ or $LiTaO_3$ layer, is formed on the dielectric layer 12. The bulk substrate 11 may be supported by posts 14. According to an embodiment, the bulk substrate 11 and the posts 14 are formed integrally, for example, by providing an initial bulk substrate and forming a recess in the initial bulk substrate in order to form the bulk substrate (membrane) 11. The SAW pressure sensor device 10 may, furthermore, comprise a supporting substrate, lid and/or seals as known in the art.

The transducer T of this POI device 10 converts an radiofrequency interrogation signal received by the antenna into a surface acoustic wave that is reflected back by the Bragg mirrors M1 and M2 of the resonance cavities R1 and R2 and converted back into a radiofrequency signal that in course is transmitted by the antenna (or another antenna) as a radiofrequency response signal. The SAW pressure sensor device 10 may operate at Bragg conditions with wavelengths of the excited surface acoustic waves of some multiples of the pitches of the comb electrodes of the comb transducer T. When operation is performed at Bragg conditions the comb transducer T itself substantially functions as a mirror (with a reflectivity of at least 80%) thereby definitely separating the resonance cavities R1 and R2 from each other.

Figure 2A:
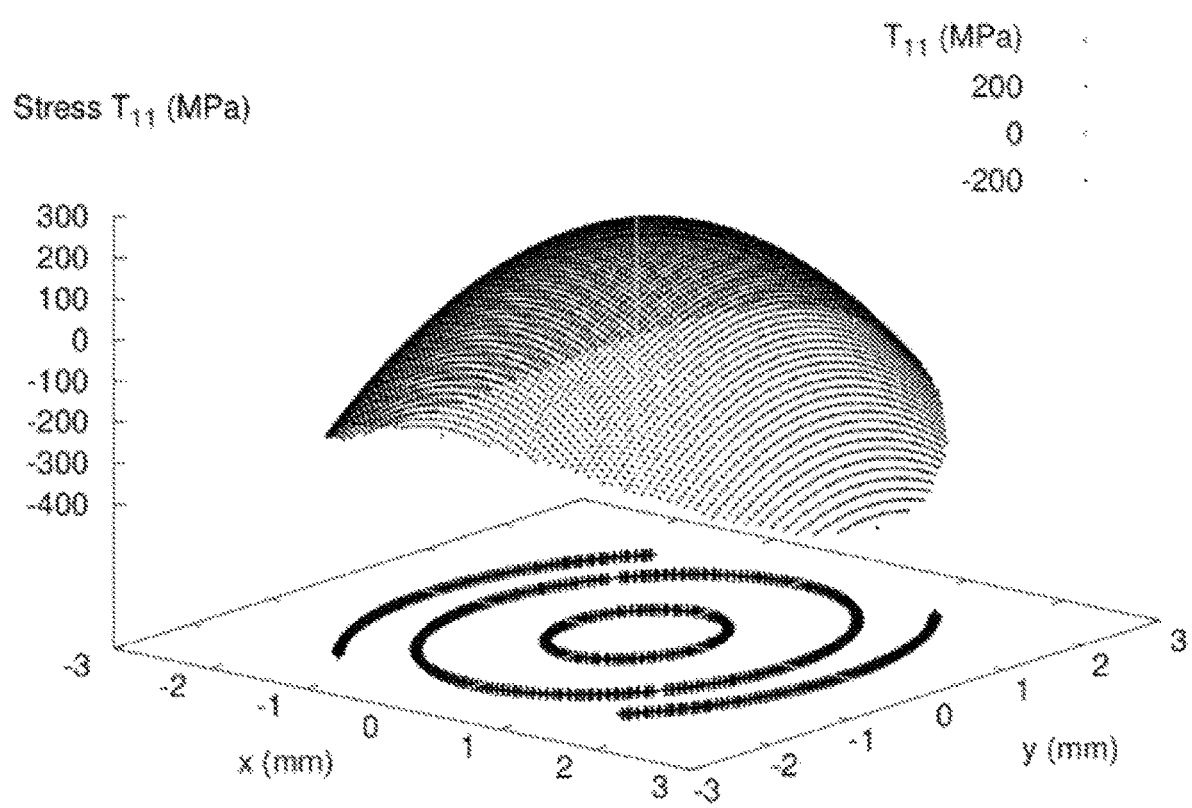
FIG. 2A represents an illustration of the strain distribution in a bulk substrate of a surface acoustic wave pressure sensor device according to an embodiment of the present disclosure when an ambient pressure is applied.
Figure 2B:
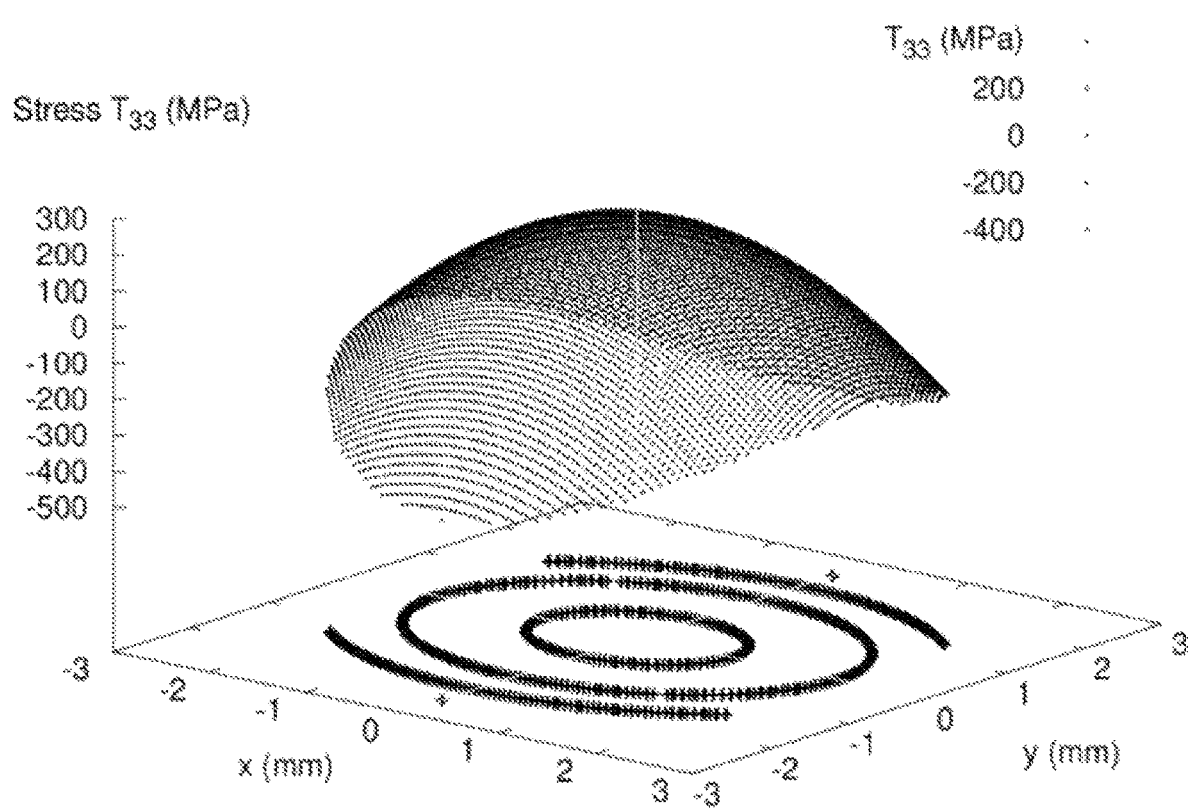
FIG. 2B represents another illustration of the strain distribution in a bulk substrate of a surface acoustic wave pressure sensor device according to the embodiment.
Figure 2C:
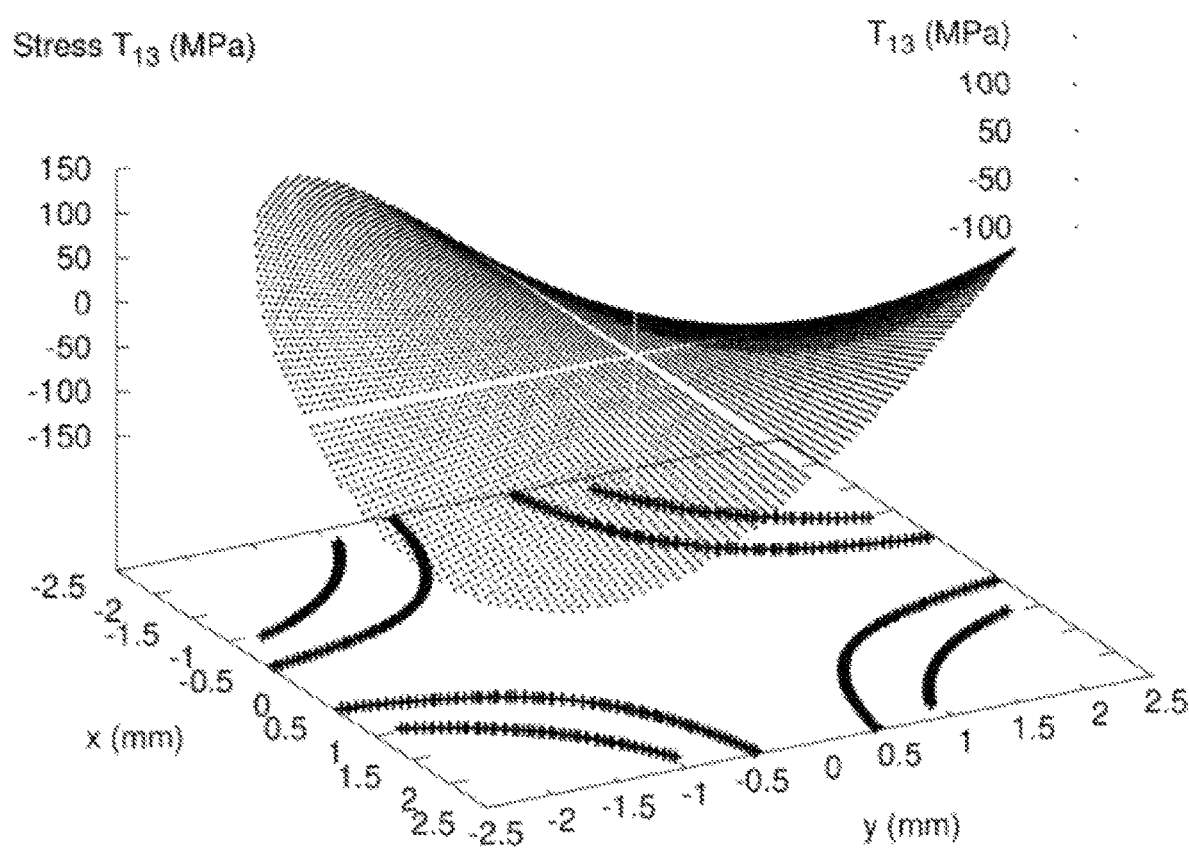
FIG. 2C represents another illustration of the strain distribution in a bulk substrate of a surface acoustic wave pressure sensor device according to the embodiment.

When some pressure is homogeneously applied to the bulk substrate 11 (see arrows in FIG. 1), the bulk substrate 11 will bend and, thereby, exhibit an area of compressive strain (more at the edge of the bulk substrate (11)) and an area of tensile strain (more at the center of the bulk substrate 11). Thereby, the resonance cavity R1 will experience a compressive strain and the resonance cavity R2 will experience a tensile strain. An exemplary distribution of strain (stress) induced in the bulk substrate 11 by a pressure of 10 bar for an Si substrate of 2.5 mm radius and a thickness of 100 μm is shown in FIGS. 2A-2C. A corresponding strain will be induced in the piezoelectric layer 13. FIG. 2A shows the spatial $T_{11}$ stress distribution, FIG. 2B shows the spatial $T_{33}$ stress distribution and FIG. 2C shows the spatial $T_{13}$ stress distribution.

The resonance frequencies of the resonance cavity R1 and the resonance cavity R2 are modified by the compressive and tensile strains, respectively, thereby allowing for true differential pressure measurements. It is noted that the inventive differential pressure measurement is not restricted to the occurrence of an area of compressive strain and an area of tensile strain but rather two areas of different kinds of strain have to be present (see also description above).

The bending characteristics of the bulk substrate 11 or the entire POI configuration can be determined before-hand. According to an embodiment (see FIG. 3), the transducer T can be arranged in an area of reversal of strain induced in the (for example, circular) bulk substrate 11 in order to achieve highly reliable true differential measurements of an ambient pressure. Here, as well as in the example shown in FIG. 1, the extension lengths g1 and g2 of the resonance cavities R1 and R2, respectively, as defined by the distances of the mirrors M1 and M2 to the transducer T differ from each other in order to more clearly separate the spectral responses of the resonances on each side of the comb transducer from each other.

Furthermore, it is noted that in embodiments described above an additional sensor device, for example, an additional SAW sensor device may be provided outside of the bending bulk substrate (portion) 11, for example, above the posts 14 shown in FIG. 1, in order to measure an ambient temperature. That additional sensor device does not sense any fluctuations of an ambient pressure and, thus, can be used to obtain reference measurements of ambient temperature fluctuations. These reference measurements can be used to compensate the measurement results obtained by the SAW pressure sensor device 10 for temperature effects. In the case a residual sensitivity could occur, the derivation of stress and temperature can be performed solving an equation system relating temperature and pressure to the resonance frequencies of the sensor system.

In the above-described embodiments, it is assumed that the transducer provides for a high enough reflectivity of the generated surface acoustic waves such that the resonance frequencies of the cavities are sufficiently separated from other to reliably obtain the desired measurement results. However, depending on the reflectivity characteristics of the transducer that is used some spurious signals may overlay the wanted signals due to an insufficient separation of the resonance cavities from each other with respect to the resonance frequencies. The reflectivity on the transducer side can be enhanced by providing an additional Bragg mirror as it is exemplarily illustrated in FIG. 4. The surface acoustic wave sensor device shown in FIG. 4 comprises a first transducer T1 and a second transducer T2 or a first part T1 and a second part T2 of a transducer. The transducers T1 and T2 may be interdigitated (comb) transducers connected to an antenna for receiving an electromagnetic wave and converting the electromagnetic wave into a surface acoustic wave. In fact, the first and second transducers T1 and T2 operate in parallel (thereby functioning as one single transducer) and receive an electromagnetic wave E1 and convert the received electromagnetic wave E1 into a surface acoustic wave S1, which, after reflection by the mirrors, is sensed again by the transducers T1 and T2.

In the shown example, the first transducer T1 and the second transducer T2 share one Bragg mirror structure M1 that is positioned between them. The surface acoustic wave sensor device comprises a second Bragg mirror structure M2 that is separated from the first transducer T1 by a resonance cavity of the length g1. Further, the surface acoustic wave sensor device comprises a third Bragg mirror structure M3 that is separated from the second transducer T2 by a resonance cavity of the length g2>g1 (it should be noted that, in principle, the two resonance cavities may have the same lengths or g1<g2 may hold).

Figure 3:
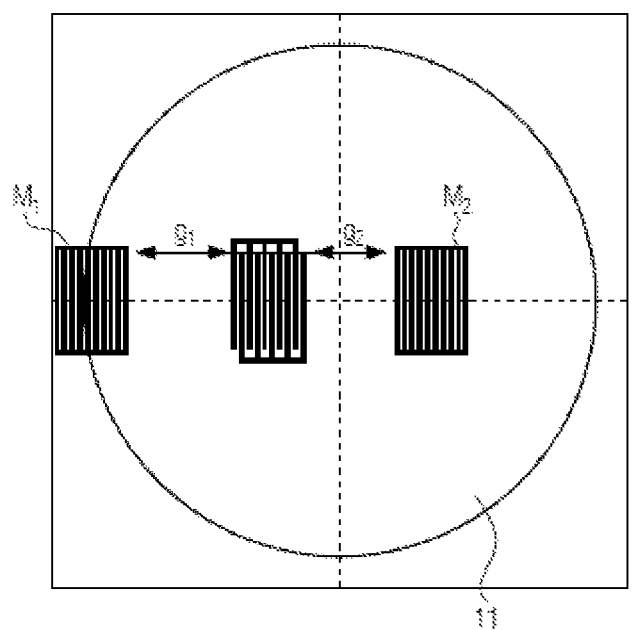
FIG. 3 represents a principle sketch showing an arrangement of a transducer and Bragg mirror structures of a surface acoustic wave pressure sensor device according to an embodiment of the present disclosure.

Operation and specifications (besides the employment of two transducers/parts of a transducer with a central mirror located therebetween) of the SAW sensor device illustrated FIG. 4 may be similar to the ones described with reference to FIGS. 1 to 3. Particularly, the SAW pressure sensor device illustrated in FIG. 4 may comprise a multi-layer substrate comprising a bulk substrate, for example, an Si substrate, formed as a membrane that bends under the application of an ambient pressure, a dielectric layer, for example, an $SiO_2$ layer, formed on the bulk substrate and a piezoelectric layer, for example, an $LiNbO_3$ or $LiTaO_3$ layer, formed on the dielectric layer.

Further, the bulk substrate may be a quartz substrate. In particular, the quartz substrate may have a cutting plane (X", Z") defined with respect to the cutting plane (X, Z) and in a reference system (X", Y", Z"), where X, Y, Z are crystallographic axes of quartz, a direction of propagation of the waves being defined along an axis X''', a first cutting plane (X', Z') being defined by rotation by an angle φ about the axis Z of the plane (X, Z) so as to define a first reference system (X', Y', Z') with an axis Z' that is the same as the axis Z, a second cutting plane (X", Z") being defined by rotation by an angle θ about the axis X' of the plane (X', Z') so as to define a second reference system (X", Y", Z") with the axis X" being the same as the axis X, the direction of propagation along the axis X''' being defined by rotation by an angle ψ of the axis X", in the plane (X", Z") about the axis Y", wherein: φ is in the range of 60° to 0°, θ is in the range of −40° (cos(3φ))±400° and ψ is in the range of 35°+10° (sin(3φ))±22.5°.

The bulk substrate may be supported by posts. The bulk substrate and the posts may be formed integrally, for example, by providing an initial bulk substrate and forming a recess in the initial bulk substrate in order to form the bulk substrate (membrane). The SAW pressure sensor device shown in FIG. 4 may, furthermore, comprise a supporting substrate, lid and/or seals as known in the art. An additional SAW sensor device may be provided outside of the bending bulk substrate (portion), for example, above the posts in order to measure an ambient temperature.

Figure 4:
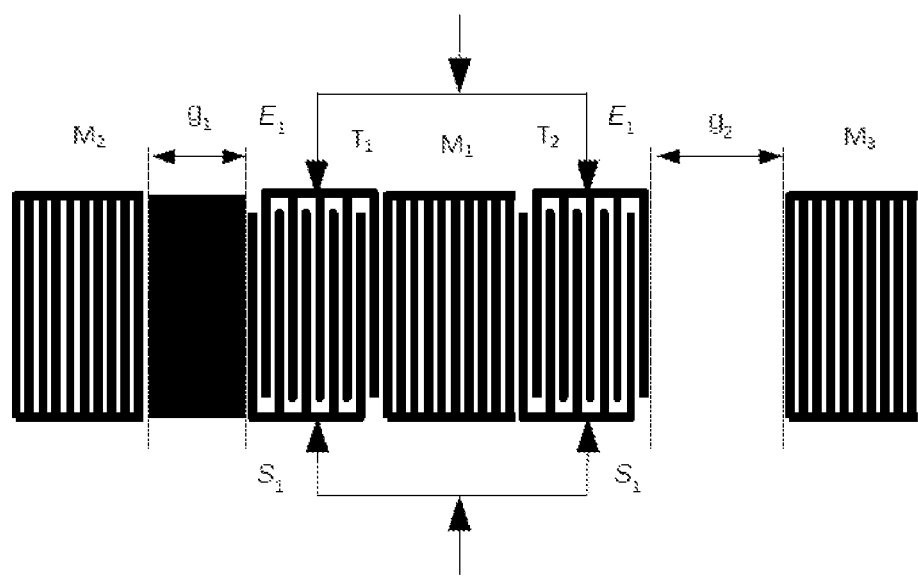
FIG. 4 represents a principle sketch illustrating a surface acoustic wave pressure sensor device comprising two transducers and a central mirror located between the two transducers according to an embodiment of the present disclosure.

It is, furthermore, noted that in the configuration shown in FIG. 4 may comprise tapered transducers with lateral extensions of the electrodes varying along the lengths of the transducers.

According to the embodiment illustrated in FIG. 4, the upper surface of the resonance cavity with length g1 comprises a physical and/or chemical modification as compared to the upper surface of the resonance cavity with length g2. Alternatively, the upper surface of the resonance cavity with length g2 could comprise a physical and/or chemical modification as compared to the upper surface of the resonance cavity with length g1. However, no surface modification may be present in other alternative embodiments.

Due to the modification of the upper surface of the resonance cavity with length g1 the propagation characteristics of acoustic waves generated by the interdigitated transducer T1 differs from the ones in the resonance cavity with length g2. Thereby, a very reliable and sensitive differential sensor apparatus for sensing pressure can be provided.

For the sake of electrical response optimization, the transducer T1 and T2 may exhibit different lengths (perpendicular to the travelling direction of the surface waves) and/or apertures as the two resonance cavities with different surface conditions exhibit different physical properties that may yield to unbalanced contributions of the corresponding modes to the sensor electrical responses. For example, a metallized resonance cavity may exhibit more losses (due to the metal properties itself or the degradation of surface roughness for instance) than a resonance cavity with a free surface. Therefore, it may be useful to increase the length of one of the two transducers to compensate for enhanced losses in the corresponding cavity and therefore provide balanced contributions of the resonance modes. However, this approach may also substantially modify the overall electrical response of the sensor, actually loading the transducer that does not suffer from the additional leakage caused by the physical and/or chemical modification with some static capacitance of the modified transducer. In this context, one might reduce the aperture of the modified transducer to benefit from the extended length yielding an enhanced signal strength and narrower transducer bandwidth and control its static capacitance to preserve the electrical sensor response. In that situation, the central mirror may actually exhibit the acoustic aperture of the largest of the two transducers to guarantee an optimal acoustic operation on both sides of the sensor device.

Without modification the first and second upper surfaces are free (exposed) surfaces, particularly, free surfaces of a piezoelectric layer of the combined acoustic wave pressure and temperature sensor device. The physical and/or chemical modification may be realized by forming a material layer (for example, a metallization layer or a passivation/dielectric layer) on the surface of the resonance cavity with length g1 only, or a material layer on the surface of the resonance cavity with length g1 and another material layer (which is made of a different material as compared to the material layer formed on the second upper surface) on the surface of the resonance cavity with length g2.

Alternatively or additionally, the physical and/or chemical modification may comprise a recess of the surface of the resonance cavity with length g1 with respect to the surface of the resonance cavity with length g2. According to further embodiments, the resonance cavity with length g1 comprises another physical and/or chemical modification that is different from the one of the resonance cavity with length g2. All combinations of the named modifications are envisaged as long as the modifications of the surfaces of the cavities differ from each other in order to guarantee different resonance characteristics of the resonance cavities. It has to be understood that the thus described surface modification of a resonance cavity can be provided for any of the embodiments disclosed herein.

Figure 5:
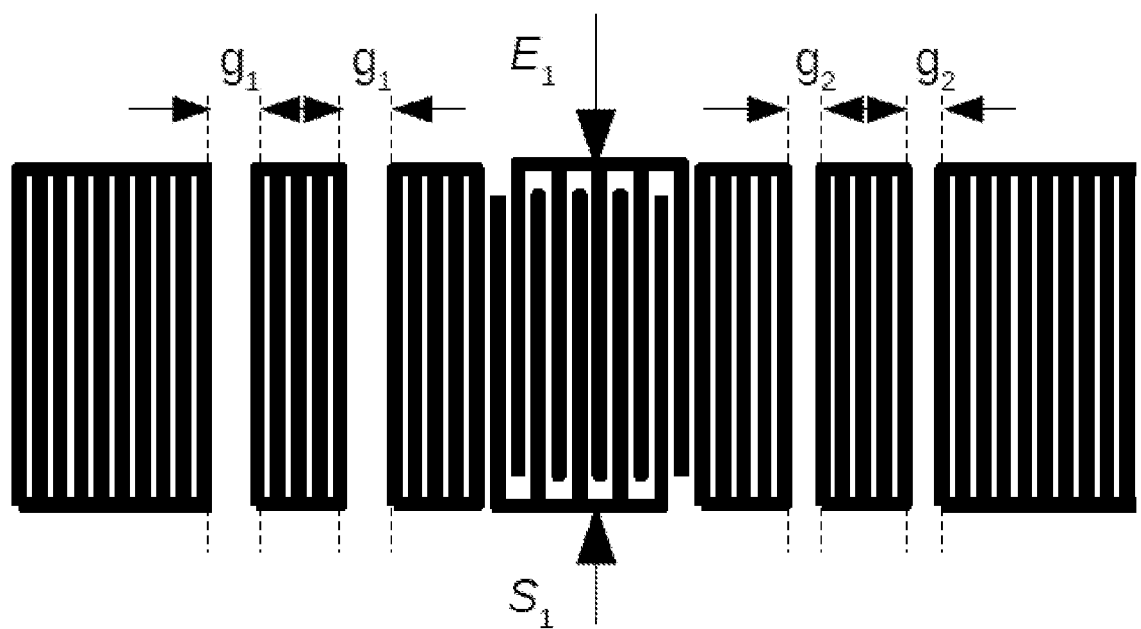
FIG. 5 represents an illustration of a cascaded resonance cavity configuration of a surface acoustic wave pressure sensor device according to an embodiment of the present disclosure.

In all of the above-described embodiments, simple resonance cavities are employed. However, all of these embodiments may employ cascaded resonance cavities comprising multiple mirror electrode structures. An exemplary embodiment comprising cascaded resonance cavities is shown in FIG. 5. In this embodiment, three mirror electrode structures separated by gaps g1 and g2 resulting in resonance sub-cavities are provided on each side of the transducer that receives an electromagnetic wave E1 and converts the electromagnetic wave into a surface acoustic wave S1. Different widths of the resonance sub-cavities g1 and g2 may result in a limitation of the number of matched resonances to only two, which is different from more than two resonances that arise in the previously described embodiments. The distance between the two resonances as well as the coupling coefficient of the resonances can be controlled by the number of the mirror electrode structures and resonance sub-cavities. As it is described with reference to FIG. 4 the surfaces of one or more of the resonance sub-cavities may comprise a physical and/or chemical modification in order to adjust the propagation speed of the excited acoustic waves in that one or more resonance sub-cavities.

In all of the above-described embodiments, the transducers operate at the Bragg condition. However, the present disclosure is not restricted to this kind of operation. As it was already mentioned in the general description above, in the case of using cascaded resonator cavities, it is possible to use a transducer that does not operate at the Bragg condition. For instance, the transducer may exhibit three or four fingers per wavelength or even 5 fingers per two wavelength and in general all suitable structures allowing to excite waves at a given synchronism without wave reflection on the IDT electrodes.

Figure 6A:
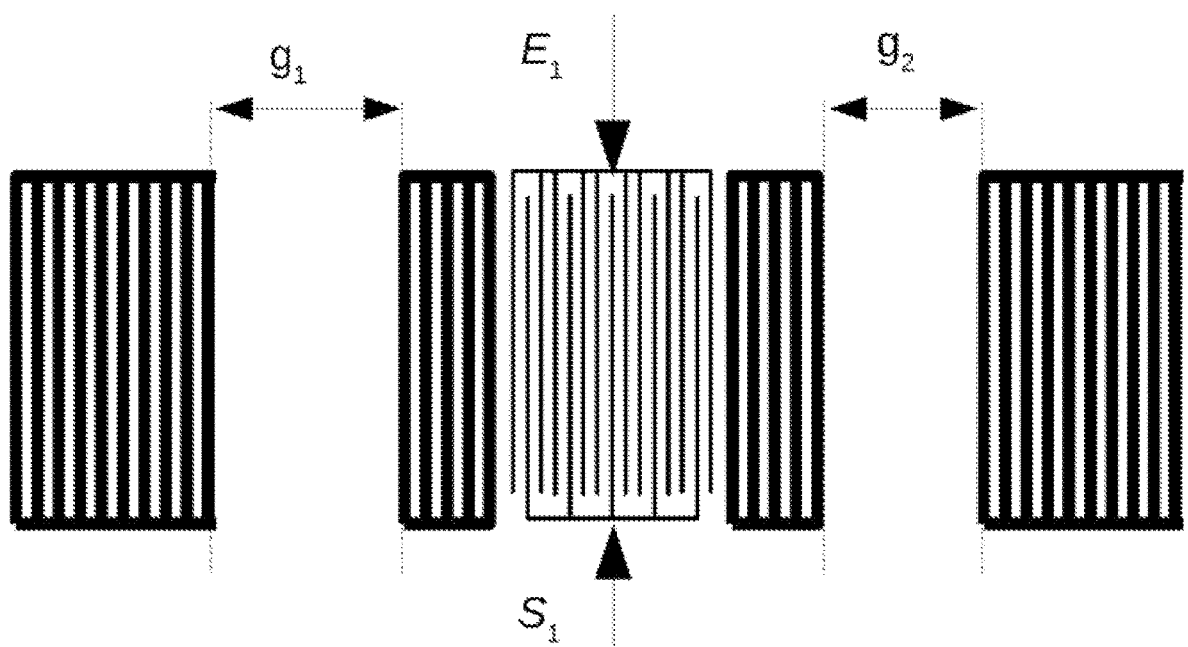
FIG. 6A represents an illustration of a cascaded resonance cavity configuration of a surface acoustic wave pressure sensor device wherein the transducer does not operate at the Bragg condition according to an embodiment of the present disclosure.
Figure 6B:
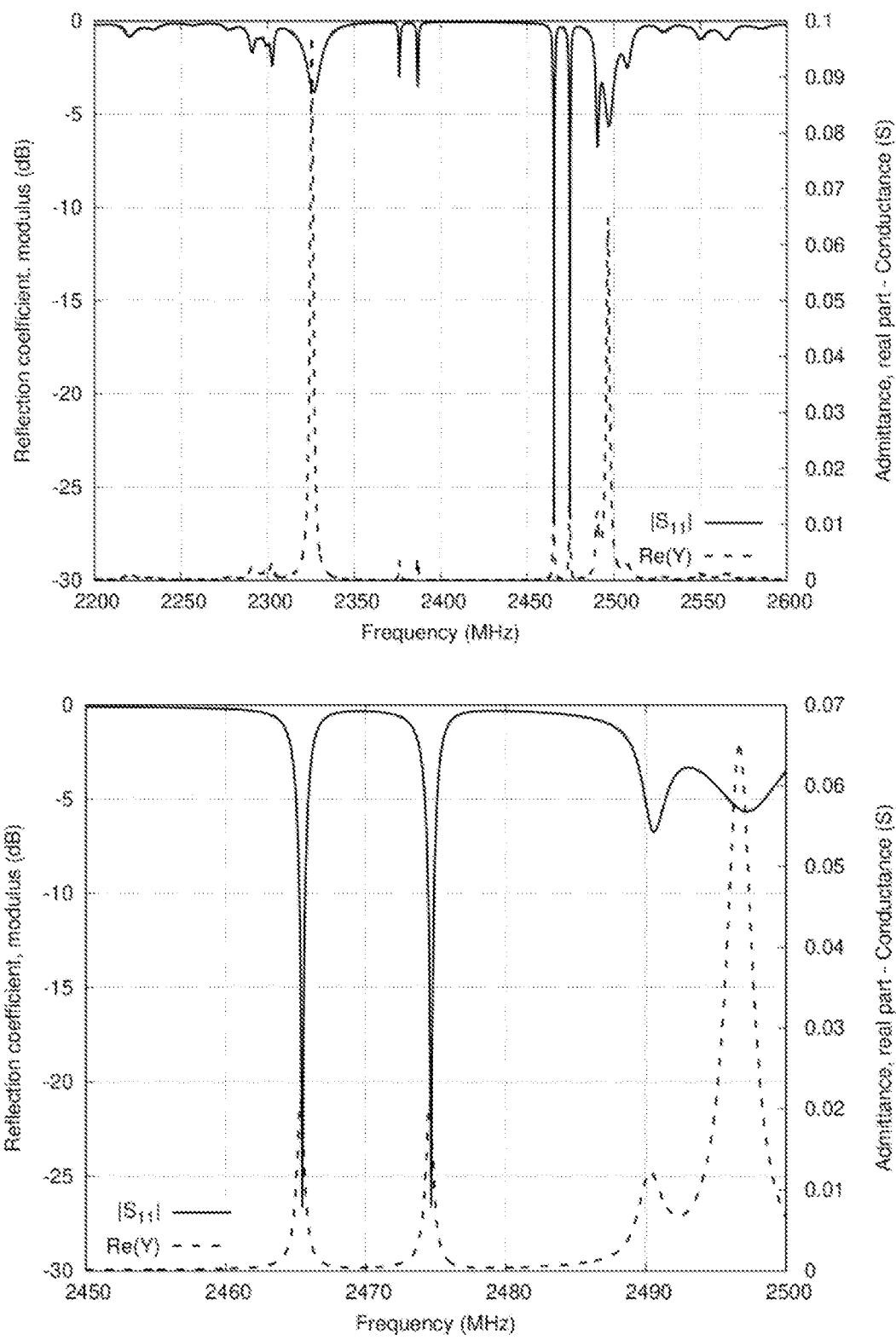
FIG. 6B shows an experimental spectral response obtained for the surface acoustic wave pressure sensor device illustrated in FIG. 6A.
Figure 7A:
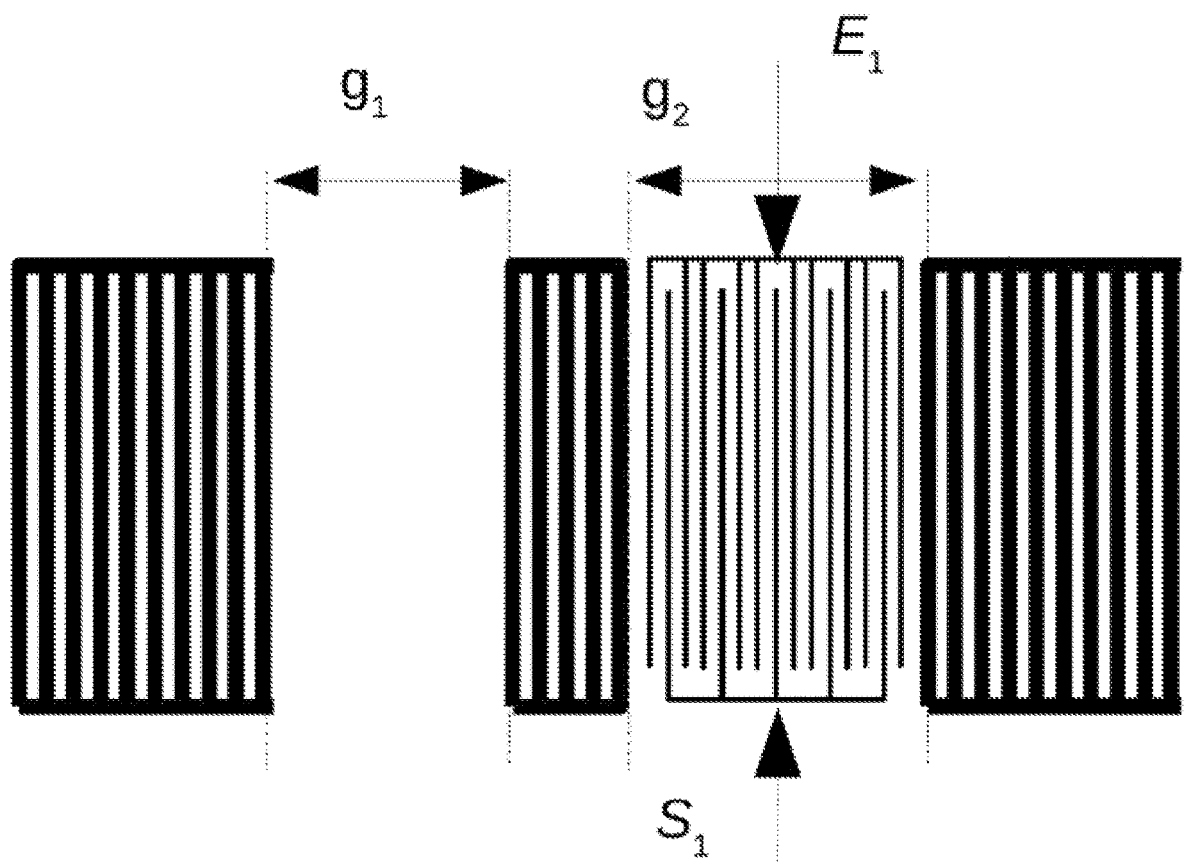
FIG. 7A represents an illustration of another cascaded resonance cavity configuration of a surface acoustic wave pressure sensor device wherein the transducer does not operate at the Bragg condition according to an embodiment of the present disclosure.
Figure 7B:
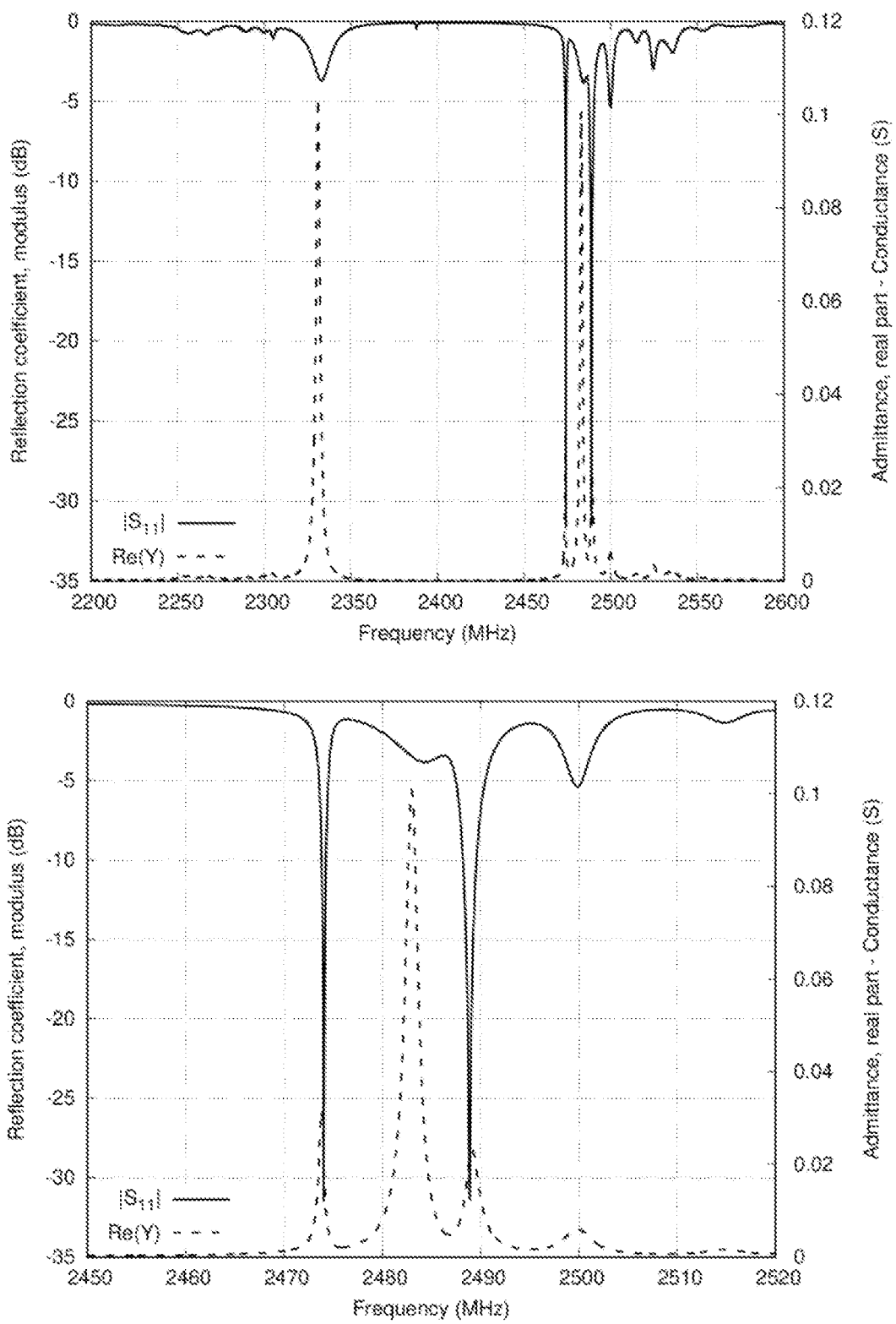
FIG. 7B shows an experimental spectral response obtained for the surface acoustic wave pressure sensor device illustrated in FIG. 7A.

Two examples for possible configurations in this respect are shown in FIGS. 6A and 7A. FIGS. 6B and 7B show corresponding experimentally obtained spectral responses. According to one configuration (see FIG. 6A) smaller mirrors are arranged close to the transducer and larger mirrors separated by distances g1 and g2, respectively, from the smaller mirrors are additionally provided to guarantee resonances in the resonance cavities as can be seen from the spectral response shown in FIG. 6B. FIG. 7A illustrates a configuration in that on the-left-hand side no Bragg condition is fulfilled for the operation of the transducer. Again, the spectral response (see FIG. 7B) shows that resonances are achieved by way of the larger mirror separated from the smaller on by the distance g1. It is worth noting that in the examples shown in FIGS. 6B and 7B, some supplementary resonances are established in the IDT region itself, i.e., the IDT operates as a supplementary cavity that could potentially be used to complete the measurements.

As already mentioned above a single acoustic wave sensor device may be supplemented by one or more additional acoustic wave sensor devices. For example, thereby combined acoustic wave pressure and temperature sensor devices can be realized as it is exemplarily illustrated in FIGS. 8 and 9. The combined acoustic wave pressure and temperature sensor device 100 shown in FIG. 8 comprises a first transducer T101 of a first sensor device and a second transducer T102 of a second sensor device. In principle, the second transducer T102 may be part of both the first and the second sensor device. The transducers T101 and T102 may be interdigitated (comb) transducers connected to an antenna for receiving an electromagnetic wave and converting the electromagnetic wave into a surface acoustic wave.

The second sensor device comprising the second transducer T102 is configured for sensing an ambient temperature. The first sensor device comprising the first transducer T101 is configured for sensing a pressure in accordance with the above-described embodiments. Additionally, the first sensor device may be also configured for sensing the ambient temperature. In this case, with respect to the sensing of the ambient temperature the first and second sensor devices constitute a differential acoustic wave temperature sensor device.

The first sensor device comprises a first Bragg mirror structure M101 that is separated from the first transducer T101 by a first resonance cavity of the length g1. Furthermore, the first sensor device comprises a second Bragg mirror structure M102 that is separated from the first transducer T101 by a second resonance cavity of the length g2. The first sensor device may be similar to the device described with reference to FIG. 3. Alternatively, it may comprise the configuration with two transducers and a central additional Bragg mirror located between the two transducers as described with reference to FIG. 4. The second sensor device comprises a third Bragg mirror structure M103 that is separated from the second transducer T102 by a third resonance cavity of the length g3 that may or may not differ from the lengths g1 and/or g2 of the first and second cavities, respectively. Another cavity with a length g4 is formed between the second Bragg mirror structure M102 and the second transducer T102.

Operation and specifications of the first sensor device of the combined sensor device 100 illustrated in FIG. 8 may be similar to the ones described with reference to FIGS. 1 to 3. Particularly, the sensor devices illustrated in FIG. 8 may comprise a multi-layer substrate comprising a bulk substrate 111, for example, an Si substrate, formed as a membrane that bends under the application of an ambient pressure, a dielectric layer, for example, an $SiO_2$ layer, formed on the bulk substrate and a piezoelectric layer, for example, an $LiNbO_3$ or $LiTaO_3$ layer, formed on the dielectric layer. The bulk substrate 111 may be supported by posts. The bulk substrate and the posts may be formed integrally, for example, by providing an initial bulk substrate and forming a recess in the initial bulk substrate in order to form the bulk substrate (membrane). The cavity with the length g3 as well as the third Bragg mirror structure M103 of the second sensor device are not formed on the substrate that is subject to the above-described bending when some external pressure is applied. The sensor device shown in FIG. 8 may, furthermore, comprise a supporting substrate, lid and/or seals as known in the art.

In particular, the upper surface of the first resonance cavity with length g1 and/or the upper surface of the resonance cavity with length g2 may or may not comprise some surface modification as it was described in the context of the embodiment illustrated in FIG. 4.

Without modification the first and second upper surfaces are free (exposed) surfaces, particularly, free surfaces of a piezoelectric layer of the combined acoustic wave pressure and temperature sensor device. The physical and/or chemical modifications may be realized by forming a material layer (for example, a metallization layer or a passivation/dielectric layer) or by controlled doping, without exclusion of other means.

Figure 8:
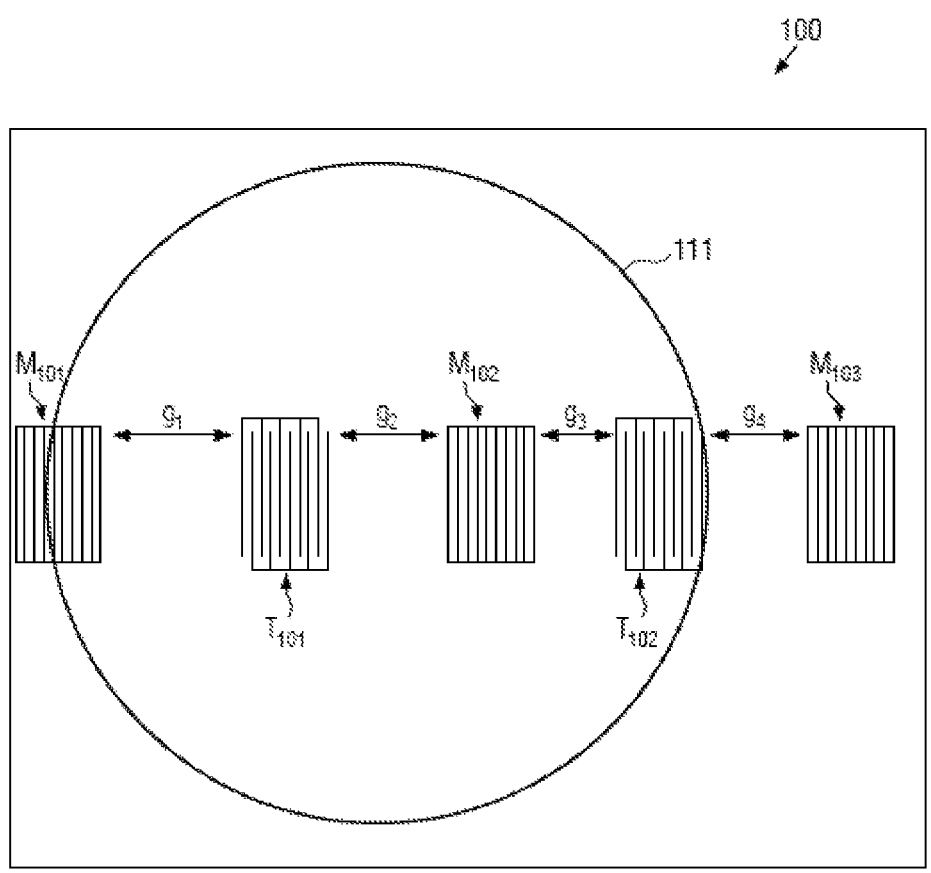
FIG. 8 represents a principle sketch illustrating a combined acoustic wave pressure and temperature sensor device according to an embodiment of the present disclosure.
Figure 9:
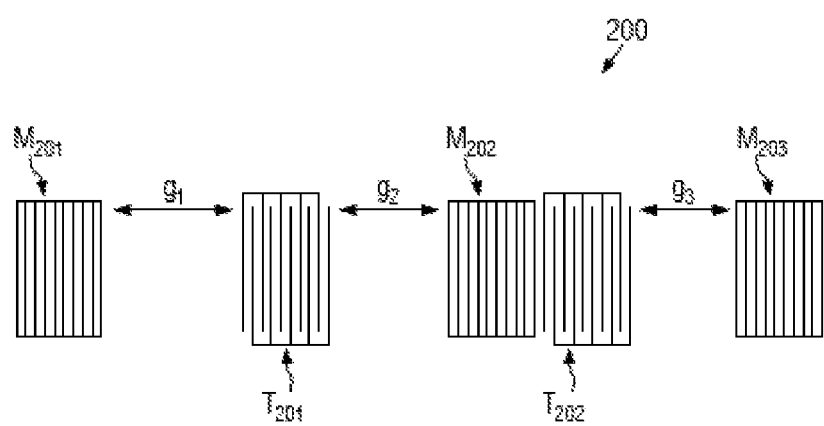
FIG. 9 represents a principle sketch illustrating a combined acoustic wave pressure and temperature sensor device according to another embodiment of the present disclosure.

FIG. 9 shows an alternative configuration to the one illustrated in FIG. 8. As compared to the configuration illustrated in FIG. 8, according to the embodiment shown in FIG. 9, the combined acoustic wave pressure and temperature sensor device 200 comprises only three rather than four cavities.

The combined sensor device 200 shown in FIG. 9 comprises a first transducer T201 of a first sensor device and a second transducer T202 of a second sensor device. The second sensor device comprising the second transducer T202 is configured for sensing an ambient temperature. The transducers T201 and T202 may be interdigitated (comb) transducers connected to an antenna for receiving an electromagnetic wave and converting the electromagnetic wave into a surface acoustic wave. The first sensor device comprising the first transducer T201 is configured for sensing a pressure in accordance with the above-described embodiments. Additionally, the first sensor device may be also configured for sensing the ambient temperature. In this case, with respect to the sensing of the ambient temperature the first and second sensor devices constitute a differential acoustic wave temperature sensor device.

The first sensor device comprises a first Bragg mirror structure M201 that is separated from the first transducer T201 by a first resonance cavity of the length g1. Furthermore, the first sensor device comprises a second Bragg mirror structure M202 that is separated from the first transducer T201 by a second resonance cavity of the length g2. The first sensor device of the combined acoustic wave pressure and temperature sensor device 200 may be similar to the device described with reference to FIG. 3. Alternatively, it may comprise the configuration with two transducers and a central additional Bragg mirror located between the two transducers as described with reference to FIG. 4. The second sensor device comprises a third Bragg mirror structure M203 that is separated from the second transducer T202 by a third resonance cavity of the length g3 that may or may not differ from the lengths g1 and/or g2 of the first and second cavities, respectively. Contrary to the configuration illustrated in FIG. 8, according to the embodiment shown in FIG. 9, the combined sensor device 200 comprises no resonance cavity between the second Bragg mirror structure M202 and the second transducer T202.

Operation and specifications of the first sensor device of the combined device illustrated in FIG. 9 may be similar to the ones described with reference to FIGS. 1 to 3. Particularly, the sensor devices illustrated in FIG. 9 may comprise a multi-layer substrate comprising a bulk substrate, for example, an Si substrate, formed as a membrane that bends under the application of an ambient pressure, a dielectric layer, for example, an SiO$_2$ layer, formed on the bulk substrate and a piezoelectric layer, for example, an LiNbO$_3$ or LiTaO$_3$ layer, formed on the dielectric layer. The bulk substrate may be supported by posts. The bulk substrate and the posts may be formed integrally, for example, by providing an initial bulk substrate and forming a recess in the initial bulk substrate in order to form the bulk substrate (membrane). The cavity with the length g3 as well as the third Bragg mirror structure M203 of the second sensor device are not formed on the substrate that is subject to the above-described bending. The sensor device shown in FIG. 9 may, furthermore, comprise a supporting substrate, lid and/or seals as known in the art.

In particular, the upper surface of the first resonance cavity with length g1 and/or the upper surface of the resonance cavity with length g2 may or may not comprise some surface modification as it was described in the context of the embodiment illustrated in FIG. 4.

Without modification the first and second upper surfaces are free (exposed) surfaces, particularly, free surfaces of a piezoelectric layer of the combined acoustic wave pressure and temperature sensor device. The physical and/or chemical modification may be realized by forming a material layer (for example, a metallization layer or a passivation/dielectric layer) or by controlled doping or by any way yielding substantial modification of the physical properties of the layer yielding a specific sensitivity to the regarded parameter.

In all of the above-described embodiments, the acoustic wave sensor device may be encapsulated, for example, by a ceramic encapsulation, and hermetically sealed at some predetermined pressure and with some selected atmosphere. If absolute pressure measurements are desired, the atmosphere is a vacuum and if relative measurements of an ambient pressure are desired, some inert gas atmosphere, for example, a nitrogen atmosphere, under some predetermined pressure may be provided.

All previously discussed embodiments are not intended as limitations but serve as examples illustrating features and advantages of the present disclosure. It is to be understood that some or all of the above described features can also be combined in different ways.

The invention claimed is:

1. An acoustic wave pressure sensor device configured to measure a pressure, the device comprising:
   a substrate configured to bend when the pressure is applied to the substrate such that an area of a first kind of strain and an area of a second kind of strain are formed in the substrate;
   an interdigitated transducer formed over the substrate;
   a first Bragg mirror formed over the substrate and arranged on one side of the interdigitated transducer;
   a second Bragg mirror formed over the substrate and arranged on another side of the interdigitated transducer;
   a first resonance cavity formed between the interdigitated transducer and the first Bragg mirror; and
   a second resonance cavity formed between the interdigitated transducer and the second Bragg mirror; and
   wherein the first resonance cavity is formed over the area of the first kind of strain and the second resonance cavity is formed over the area of the second kind of strain.

2. The acoustic wave pressure sensor device of claim 1, wherein the substrate comprises:
   a bulk substrate;
   a dielectric layer formed on the bulk substrate; and
   a piezoelectric layer formed on the dielectric layer; and wherein:
the interdigitated transducer and the first and second Bragg mirrors are formed on the piezoelectric layer and the first and second resonance cavities comprise portions of the piezoelectric layer; and
the piezoelectric layer is configured to bend when the pressure is applied to the substrate such that an area of the first kind of strain is formed in the piezoelectric layer and an area of the second kind of strain is formed in the piezoelectric layer.

3. The acoustic wave pressure sensor device of claim 2, wherein the bulk substrate comprises Si, the dielectric layer comprises $SiO_2$, and the piezoelectric layer comprises $LiNbO_3$ or $LiTaO_3$.

4. The acoustic wave pressure sensor device of claim 2, wherein the substrate is configured to exhibit, when the pressure is applied, an area of reversal of strain wherein the strain changes from the first kind of strain to the second kind of strain and the interdigitated transducer is arranged over the area of reversal of strain.

5. The acoustic wave pressure sensor device of claim 4, wherein the piezoelectric layer is configured to exhibit, when the pressure is applied, an area of reversal of strain, wherein the strain changes from the first kind of strain to the second kind of strain and the interdigitated transducer is arranged on the area of reversal of strain of the piezoelectric layer.

6. The acoustic wave pressure sensor device of claim 1, wherein the first resonance cavity comprises first resonance sub-cavities separated from each other by first reflection sub-structures of the first Bragg mirror and/or the second resonance cavity comprises second resonance sub-cavities separated from each other by second reflection sub-structures of the second Bragg mirror.

7. The acoustic wave pressure sensor device of claim 1, wherein extension lengths of the first resonance cavity and the second resonance cavity differ from each other.

8. The acoustic wave pressure sensor device of claim 1, wherein the acoustic wave pressure sensor device is a passive surface acoustic wave pressure sensor device and comprises a transmission antenna and a reception antenna.

9. The acoustic wave pressure sensor device of claim 1, wherein the first kind of strain is a compressive strain and/or the second kind of strain is a tensile strain.

10. A combined acoustic wave pressure and temperature sensor device, comprising:
an acoustic wave pressure sensor device according to claim 1; and
an additional acoustic wave sensor device, wherein the acoustic wave pressure sensor device according to claim 1 and the additional acoustic wave sensor device are configured to differentially measure an ambient temperature, and wherein a surface of a resonance cavity of the additional acoustic wave sensor device is physically and/or chemically modified with respect to a surface of a resonance cavity of the acoustic wave pressure sensor device according to claim 1.

11. A system for monitoring/measuring an ambient pressure, comprising an interrogation device and an acoustic wave pressure sensor device according to claim 1, the acoustic wave pressure sensor device being communicatively coupled to the interrogation device.

12. A method of manufacturing an acoustic wave pressure sensor device, the method comprising:
providing a substrate configured to bend when a pressure is applied to the substrate such that an area of a first kind of strain and an area of a second kind of strain are formed in the substrate;
determining the locations of the area of the first kind of strain and the area of the second kind of strain of the substrate;
forming an interdigitated transducer over the substrate;
forming a first Bragg mirror over the substrate on one side of the interdigitated transducer such that a first resonance cavity is formed between the interdigitated transducer and the first Bragg mirror over the determined location of the area of the first kind of strain of the substrate; and
forming a second Bragg mirror over the substrate on another side of the interdigitated transducer such that a second resonance cavity is formed between the interdigitated transducer and the second Bragg mirror over the determined location of the area of the second kind of strain of the substrate.

13. The method of claim 12, wherein providing the substrate comprises:
providing a bulk substrate;
forming a dielectric layer on the bulk substrate; and
forming a piezoelectric layer on the dielectric layer; and
wherein:
the interdigitated transducer and the first and second Bragg mirrors are formed on the piezoelectric layer and the first and second resonance cavities comprise portions of the piezoelectric layer; and
the piezoelectric layer is configured to bend when the pressure is applied to the substrate such that an area of the first kind of strain is formed in the piezoelectric layer and an area of the second kind of strain is formed in the piezoelectric layer.

14. The method of claim 12, wherein the transducer is formed over an area of reversal of strain of the substrate, the area of reversal of strain being an area wherein, when the pressure is applied, the strain changes from the first kind of strain to the second kind of strain.

15. The method according to claim 14, wherein the interdigitated transducer is formed on an area of reversal of strain of the piezoelectric layer, the area of reversal of strain being an area wherein, when the pressure is applied, the strain changes from the first kind of strain to the second kind of strain.

16. The method of claim 12, wherein forming the first Bragg mirror comprises forming first reflection sub-structures and/or forming the second Bragg mirror comprises forming second reflection sub-structures such that the first resonance cavity comprises first resonance sub-cavities separated from each other by the first reflection sub-structures of the first Bragg mirror and/or the second resonance cavity comprises second resonance sub-cavities separated from each other by the second reflection sub-structures of the second Bragg mirror.

17. The method of claim 12, wherein extension lengths of the first resonance cavity and the second resonance cavity differ from each other.

18. The method of claim 13, wherein the dielectric layer comprises $SiO_2$.

19. The method of claim 13, wherein the piezoelectric layer comprises $LiNbO_3$ or $LiTaO_3$.

20. The acoustic wave pressure sensor device of claim 1, wherein the substrate is configured to exhibit, when the pressure is applied, an area of reversal of strain wherein the strain changes from the first kind of strain to the second kind of strain and the interdigitated transducer is arranged over the area of reversal of strain.

* * * * *